United States Patent
Enders

(10) Patent No.: US 7,109,091 B2
(45) Date of Patent: Sep. 19, 2006

(54) METHOD FOR PROCESSING A SUBSTRATE TO FORM A STRUCTURE

(75) Inventor: Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 236 days.

(21) Appl. No.: 10/340,047

(22) Filed: Jan. 10, 2003

(65) Prior Publication Data

US 2003/0129837 A1    Jul. 10, 2003

(30) Foreign Application Priority Data

Jan. 10, 2002    (DE) ................................ 102 00 678

(51) Int. Cl.
*H01L 21/706*    (2006.01)
(52) U.S. Cl. ........................ 438/404; 438/424; 438/690
(58) Field of Classification Search ................ 438/404, 438/424–435, 692–693
See application file for complete search history.

(56) References Cited

U.S. PATENT DOCUMENTS

| | | | |
|---|---|---|---|
| 4,571,819 A * | 2/1986 | Rogers et al. | 438/430 |
| 4,871,689 A * | 10/1989 | Bergami et al. | 438/427 |
| 5,278,438 A | 1/1994 | Kim et al. | |
| 5,420,067 A | 5/1995 | Hsu | |
| 5,907,775 A | 5/1999 | Tseng | |
| 5,990,002 A * | 11/1999 | Niroomand et al. | 438/636 |
| 6,239,465 B1 * | 5/2001 | Nakagawa | 257/331 |
| 6,573,556 B1 * | 6/2003 | Doong et al. | 257/315 |
| 6,794,242 B1 * | 9/2004 | Dyer et al. | 438/244 |
| 2002/0167041 A1 * | 11/2002 | Tseng | 257/315 |

FOREIGN PATENT DOCUMENTS

| | | |
|---|---|---|
| DE | 197 32 870 A1 | 2/1999 |
| DE | 100 39 441 A1 | 2/2002 |
| JP | 2000260887 A | 9/2000 |
| WO | WO 00/41238 | 7/2000 |

\* cited by examiner

*Primary Examiner*—Duy-Vu N Deo
(74) *Attorney, Agent, or Firm*—Laurence A. Greenberg; Werner H. Stemer; Ralph E. Locher

(57) ABSTRACT

A method for processing a substrate to produce a structure, for example an insulating trench, uses a lithographic mask exposure process. Conventionally, the optical resolution limit prescribes the minimum width for any structure that can be produced. The method produces structures having a width less than the optical resolution limit on raised regions of the semiconductor substrate. Use is made of spacer technology, before the application of which the method first involves the local level ratios on the semiconductor substrate being reversed by trench etching, trench filling and subsequent back-etching of the trench interspace. The method allows insulating trenches of any narrow width between zero and the respective optical resolution limit to be produced on locally raised surface regions of the substrate.

9 Claims, 8 Drawing Sheets

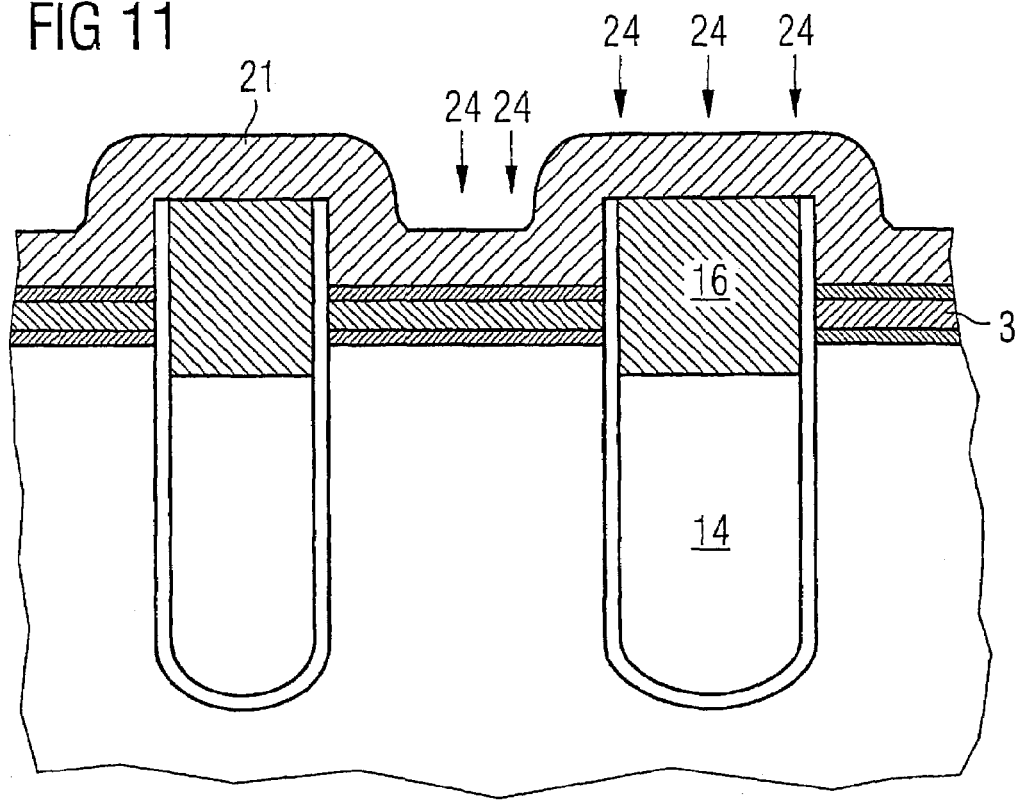
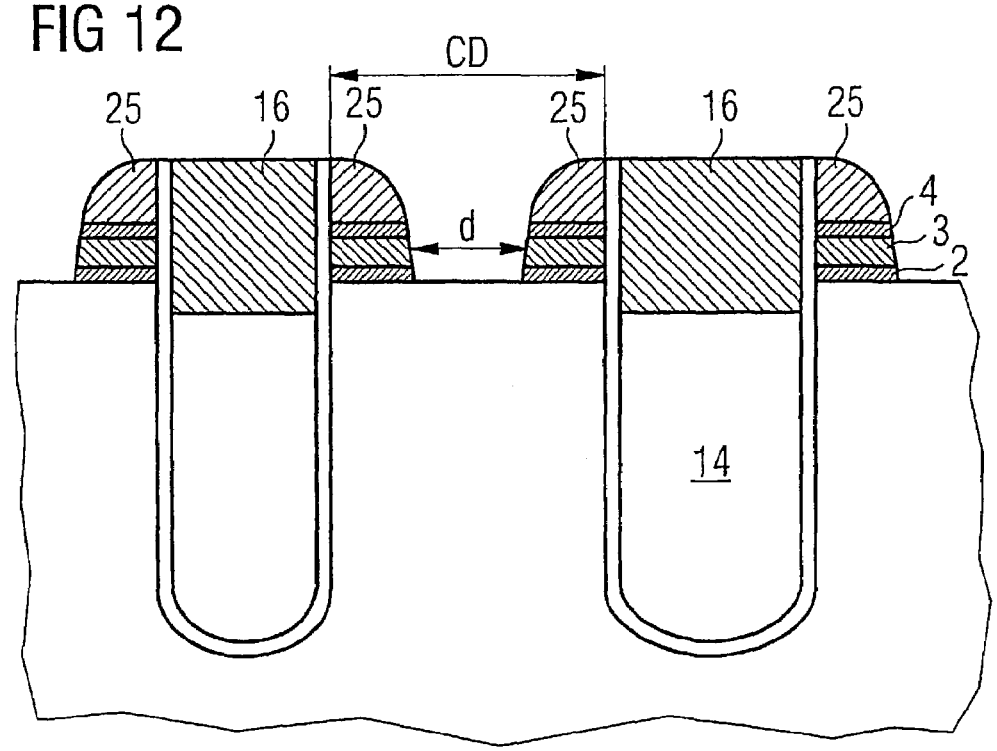

METHOD FOR PROCESSING A SUBSTRATE TO FORM A STRUCTURE

BACKGROUND OF THE INVENTION

Field of the Invention

The invention relates to a method for processing a substrate to form a structure using lithographic mask exposure. Such methods are used in semiconductor fabrication in order to produce integrated semiconductor circuits having a large number of microscopic components that are integrated on a semiconductor chip. The production involves performing a large number of method steps that act on the entire surface of the semiconductor substrate. To use such method steps to produce microscopically small structures, masks having suitably disposed mask openings achieve selective alteration of the substrate surface in prescribed surface regions. As a result, the method steps alter the semiconductor surface only in those surface regions that are covered by a mask, for example.

A major problem during miniaturization of integrated semiconductor circuits is that the light used for lithographically exposing a layer on the semiconductor substrate through a mask, has a prescribed wavelength permitting only the production of microscopic structures whose lateral dimensions are approximately at least the same size as the wavelength of the light. The optical resolution limit, i.e. the smallest lithographically producible structure width (critical dimension (CD)), indicates the minimum width from which microscopic structures can be produced on the semiconductor surface using lithographic exposure. The optical resolution limit for lithographic mask exposure is obtained not just from the wavelength of the light used (today in the ultraviolet range) but also takes into account process fluctuations and positional errors for superimposed structures.

The more and more complex semiconductor circuits and computer programs to be operated thereon require smaller and smaller dimensions for the microelectronic structures, given a limited chip area. A reduction in the size of the structures could be achieved most easily by choosing radiation with a shorter wavelength for the lithographic mask exposure. However, the high cost involved in changing over all the lithographic instruments for radiation with a shorter wavelength is so considerable that the lithographic instruments actually provided, whose wavelength has been prescribed, are used to attempt to take any possible reduction in size up to the optical resolution limit, and sometimes beyond. In some cases, phase masks are also used which allow the dimensions of lithographically produced structures to be reduced in size to a small degree below the exposure wavelength. However, such masks can be used only for limited sample designs, and in this case too the distance between various structures of the sample is directly dependent on the structure width of the lithographic mask exposure.

Spacer technology can be used to deposit spacers, i.e. sidewall coverings, on sidewalls of depressions. In this case, spacers, i.e. sidewall coverings, are produced on sidewalls of depressions. The additional structures have widen elevations. Locally raised regions of a semiconductor substrate can therefore conventionally only be widened, which results in that no structures can be produced on them which are narrower than the optical resolution limit.

SUMMARY OF THE INVENTION

It is accordingly an object of the invention to provide a method for processing a substrate to form a structure that overcomes the above-mentioned disadvantages of the prior art methods of this general type, which uses lithography to produce, on locally raised regions of a semiconductor substrate, structures whose width is less than the optical resolution limit prescribed by lithographic mask exposure.

With the foregoing and other objects in view there is provided, in accordance with the invention, a method for processing a substrate to form a structure using lithographic mask exposure. The method includes the steps of: providing a substrate, etching two trenches disposed at a distance from one another and corresponding to an optical resolution limit of the lithographic mask exposure, filling the trenches with a trench filling resulting in filled trenches, and back-etching a material other than a material of the trench filling in an interspace between the filled trenches at a level of the trench filling resulting in a depression. Spacers are produced in the depression on opposite sidewalls of the depression. The spacers are at a distance from one another that is less than the optical resolution limit for the lithographic mask exposure. An etching process is performed in a region of the depression for forming an insulating trench disposed between the spacers. A width of the insulating trench is less than the optical resolution limit for the lithographic mask exposure.

In line with the invention, in a prescribed structure which is produced lithographically and whose width is therefore prescribed by the optical resolution limit of corresponding lithographic mask exposure, smaller structures are formed, specifically on opposite sidewalls of the lithographically produced structure. The width of the structures on the sidewalls is utilized to form a mask opening that is smaller, possibly even much smaller, than the optical resolution limit and the depression, which is at least as wide. Between the structures on the sidewalls, it is then possible to produce a further structure—the actual structure to be produced—in the exposed substrate surface.

Hence, auxiliary structures are formed to the right and left on opposite sidewalls of the depression, between which auxiliary structures there remains a distance which is less than the optical resolution limit and which allows the production of structures below the optical resolution limit. In this context, the present invention makes use of spacer technology. Spacer technology is used for producing distancing pieces, also called spacers, which are produced during layer deposition on geometric levels of the semiconductor surface and are used in subsequent process steps to achieve a slight lateral offset in the action of subsequent process steps relative to the level. According to the invention, the technology is used to produce a spacer both to the left and to the right in a lithographically produced depression. This produces sidewall coverings whose width can be adjusted within wide ranges. The width of the sidewall coverings, which can be used in accordance with the invention, extends as far as half of the width of the lithographically produced depression, as a result of which the two sidewall coverings effectively have a mask window formed between them whose width can assume any desired value between zero and the lithographic resolution limit.

The invention provides for two trenches disposed at a distance from one another which corresponds to the optical resolution limit for the lithographic mask exposure to be etched and to be filled with a trench filling, and for a depression to be formed by back-etching a different material than the material of the trench filling in the interspace between the filled trenches at the level of the trench filling. This serves to produce structures with lateral dimensions below the resolution limit outside of depressions as well, i.e. on raised surface regions. This development is based on the concept of reversing the level ratio of the substrate surface in various surface regions by a sequence containing a plurality of layer processes. In accordance with the basic concept of the present invention, involving producing spacers on both sidewalls of a depression, this development requires two trenches. The trenches are first structured, with their distance apart being chosen to be as short as possible, namely corresponding to the resolution limit. The width of the trenches themselves is of the same magnitude as the optical resolution limit. The trenches are etched and are then filled with a mask filling. The mask fillings can also contain a series of layers. In order for the depression to be subsequently formed in the surface region between the two filled trenches, the surface of the substrate is back-etched in the interspace between the trenches; this is done selectively for the material which the trench filling contains at least in its top, exposed region. This series of layer processes converts the interspace between the trenches, which interspace initially formed an elevation between the trench openings, into a depression between the trench fillings, which are now raised. A structure of arbitrarily small lateral dimensions can be produced in the depression only using the inventive methods.

Preferably, before the two trenches are etched, a sacrificial layer is deposited and the sacrificial layer is back-etched in the interspace between the trenches. The sacrificial layer is used to allow back-etching over a prescribed, precisely set level. The back-etching is performed selectively for a material which is below the sacrificial layer and can be the substrate material or else a material for a layer above. In the interspace between the trenches, the sacrificial layer is back-etched over its entire layer thickness.

The etched insulating trench can then be filled using an electrical insulator.

One preferred embodiment of the inventive method provides for a trench, particularly an insulating trench, to be etched between the spacers. The insulating trench preferably extends essentially into the semiconductor substrate and can be used to provide electrical insulation among adjacent microelectronic components, for example adjacent memory cells. Instead of trench etching, the machining of the semiconductor substrate to form a structure can also be, by way of example, dopant implantation or epitaxial growth of a layer or of a series of layers, however. The inventive method can also include any other processing steps for producing a structure whose width is less than the lithographically prescribed optical resolution limit.

A preferred embodiment oriented toward spacer technology provides for the spacers to be produced by depositing a conformal layer onto the substrate after the depression has been formed and back-etching it in a direction perpendicular to the surface of the substrate using anisotropic etching. In a first step in the production of spacers, a spacer layer is deposited which accumulates on horizontal and vertical surface regions of the semiconductor substrate in a virtually even layer thickness and is therefore referred to as conformal. In a second step, the layer is completely back-etched, i.e. removed, by dry etching using reactive ions which are accelerated in a direction perpendicular to the substrate surface, at least up to the spacer layer on the horizontal surface regions, i.e. those perpendicular to the direction of acceleration and parallel to the substrate surface. In this case, only the layer thickness of the spacer layer is removed. On sidewalls, which the reactive ions attack only from above, the spacer layer is removed only in the topmost region over a thickness that corresponds to the layer thickness on horizontal surface regions. Underneath, remains of the spacer layer, the actual spacers, i.e. distancing pieces or sidewall coverings whose width corresponds to the original layer thickness of the spacer layer at least at the bottom end of the sidewall, are formed on the sidewalls. Using the layer thickness in the first step of spacer production, the width of the distancing pieces can therefore be set. The inventive use of the spacer layer allows a lithographically produced depression to be covered from opposite sidewalls up to the center between the two sidewalls. The desired width of the structure now produced in the center is simply set by the thickness of the spacer layer.

Preferably, a conformal layer essentially containing silicon dioxide is deposited in order to produce the spacers. The material silicon dioxide can be used as a hard mask during the subsequent machining of the substrate to produce the structure between the two spacers. However, the spacers can also contain a plurality of superposed layers, one of which, for example the top layer, is made of silicon dioxide.

Preferably, a sacrificial layer containing a nitride, particularly containing silicon nitride, is deposited. This material can be etched selectively for oxides or metals.

In one embodiment, between etching the two trenches and filling the trenches, a first insulating layer, a dielectric layer and a second insulating layer are deposited onto the internal walls of the trenches. This produces a three-layer series of three very thin layers whose cross section runs along the internal wall in a U shape, for example. They form an inner wall covering for the etched trenches.

In a development subsequent to the above embodiment, word lines are formed in the two trenches. These allow the electrical potential of the dielectric layer on the left and right internal walls of the trenches to be altered. The dielectric layer can be used to produce a nonvolatile semiconductor memory. If source and drain connections in the form of superficial implantations are respectively produced on the left and right sidewalls of a trench, the dielectric layer forms, besides these implantations, a respective floating gate whose electrical potential can be set using a word line (the gate connection) formed in the trench and also using the source and drain connections. In the dielectric layer electrically insulated from both sides by the first and second insulating layers, electrical charges for long-term storage are introduced by the tunnel effect. A memory transistor can thus be produced in the left and right sidewalls of a trench.

In one embodiment of the inventive method, a preprocessed semiconductor substrate having at least one gate oxide layer is provided in a first step. The preprocessed semiconductor substrate can have further layers that can also be already structured. In this case, the depression is formed not in the substrate material of the semiconductor substrate but rather in one or more layers above.

Other features which are considered as characteristic for the invention are set forth in the appended claims.

Although the invention is illustrated and described herein as embodied in a method for processing a substrate to form a structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 16 are diagrammatic, sectional views showing a semiconductor substrate in various stages of production according to the invention.

DESCRIPTION OF THE PREFERRED EMBODIMENTS

Figure 1:
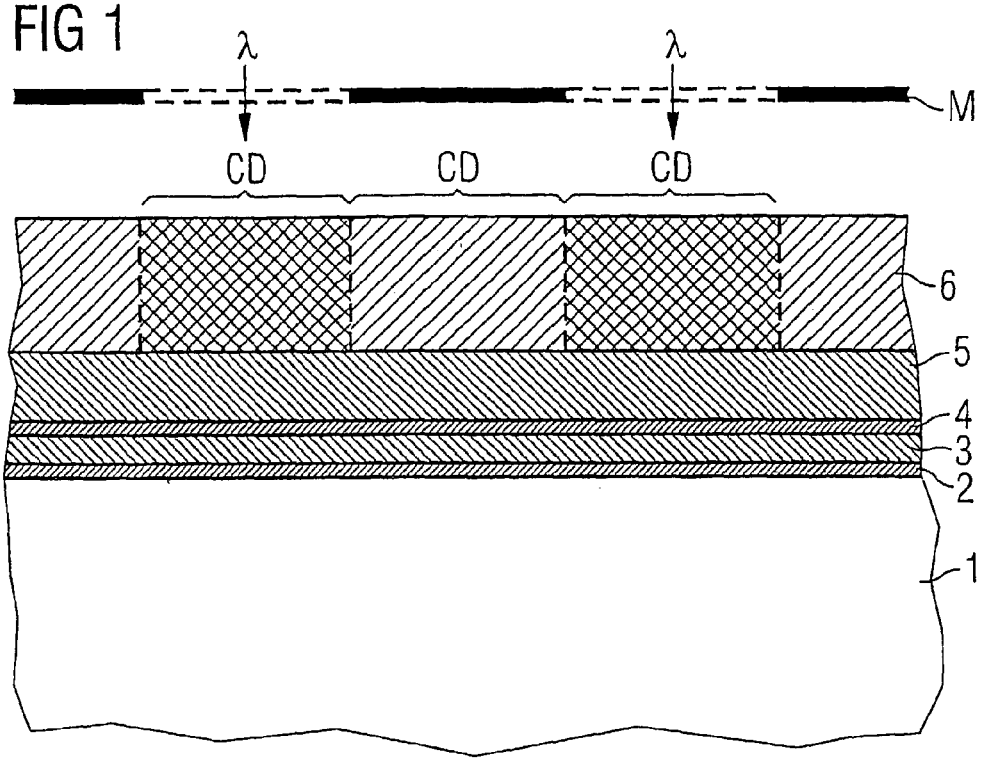

Referring now to the figures of the drawing in detail and first, particularly, to FIG. 1 thereof, there is shown an oxide layer 2 grown thermally on a semiconductor substrate 1. Next, a first nitride layer 3, an oxide layer 4 and a second nitride layer 5 are deposited in succession. The oxide layer 4 is preferably made of the same material as the gate oxide layer 2, i.e. silicon dioxide. The nitride layers 3, 5 are preferably silicon nitride layers. The layer stack produced in this way then has a mask layer 6 made of borosilicate glass, for example, deposited onto it. The structure obtained in this manner is shown in FIG. 1. To structure the hard mask 6, a non-illustrated resist layer is first deposited and is lithographically exposed through a mask M. The mask M is not shown to scale. The light of wavelength λ passing through it produces structures in the resist layer that have the width of the optical resolution limit CD and in which the resist layer and then the mask layer 6 are removed. The resist layer is then removed completely in the entire region of the substrate surface and etching is performed in the region of the etched openings in the mask layer on the layers underneath right into the substrate 1.

Figure 2:
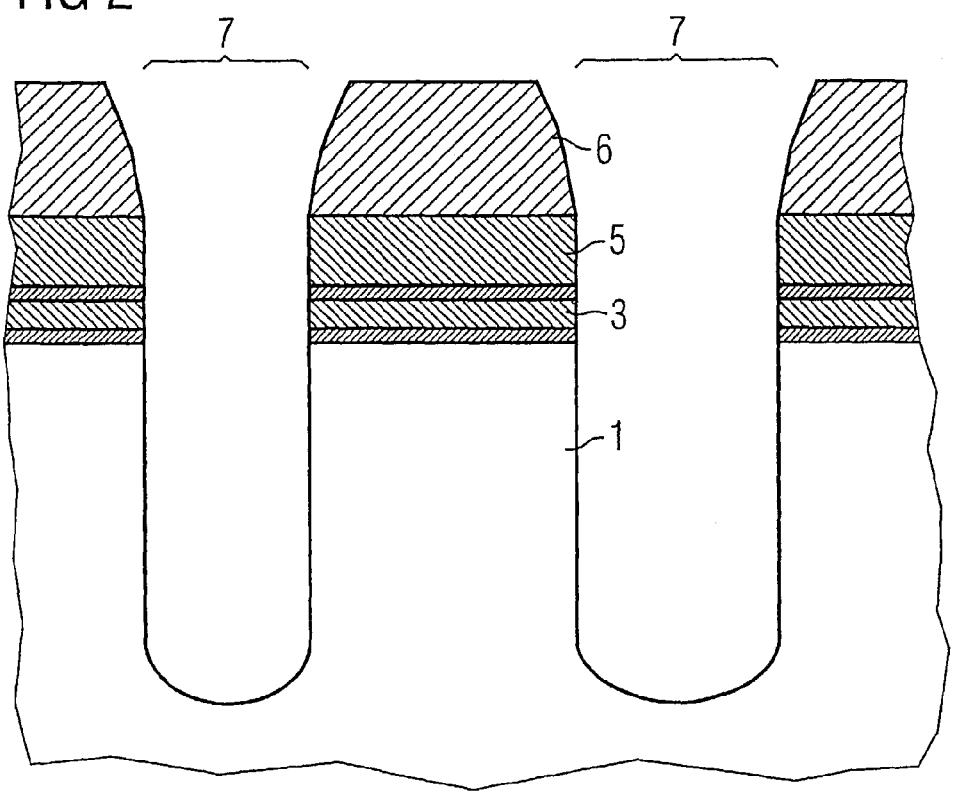

The structure obtained in this manner is shown in FIG. 2. It contains two trenches whose width and distance from one another respectively correspond to the optical resolution limit CD for the lithographic mask exposure. Smaller structures in the lateral direction cannot be produced in a conventional manner using lithographic techniques.

Figure 3:
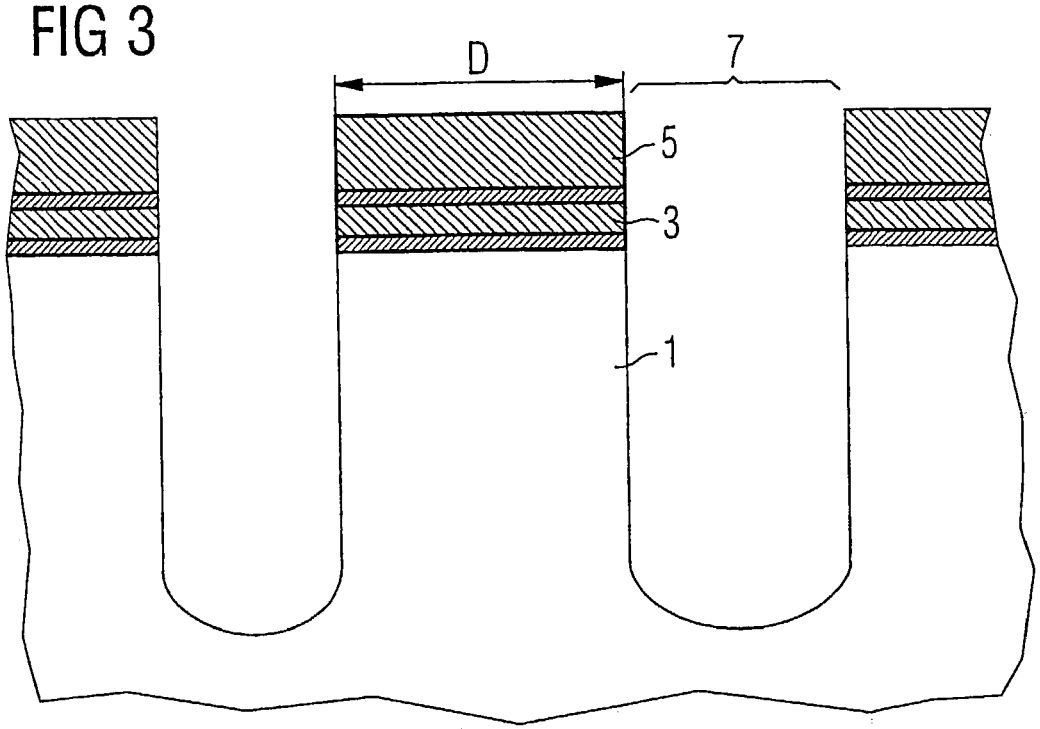

Following back-etching of the mask layer 6, whose sidewalls may be obliquely inclined on account of the etching process stopping, the structure shown in FIG. 3 is produced, with two etched trenches 7 at a distance D from one another which is of the same magnitude as the optical resolution limit CD.

Figure 4:
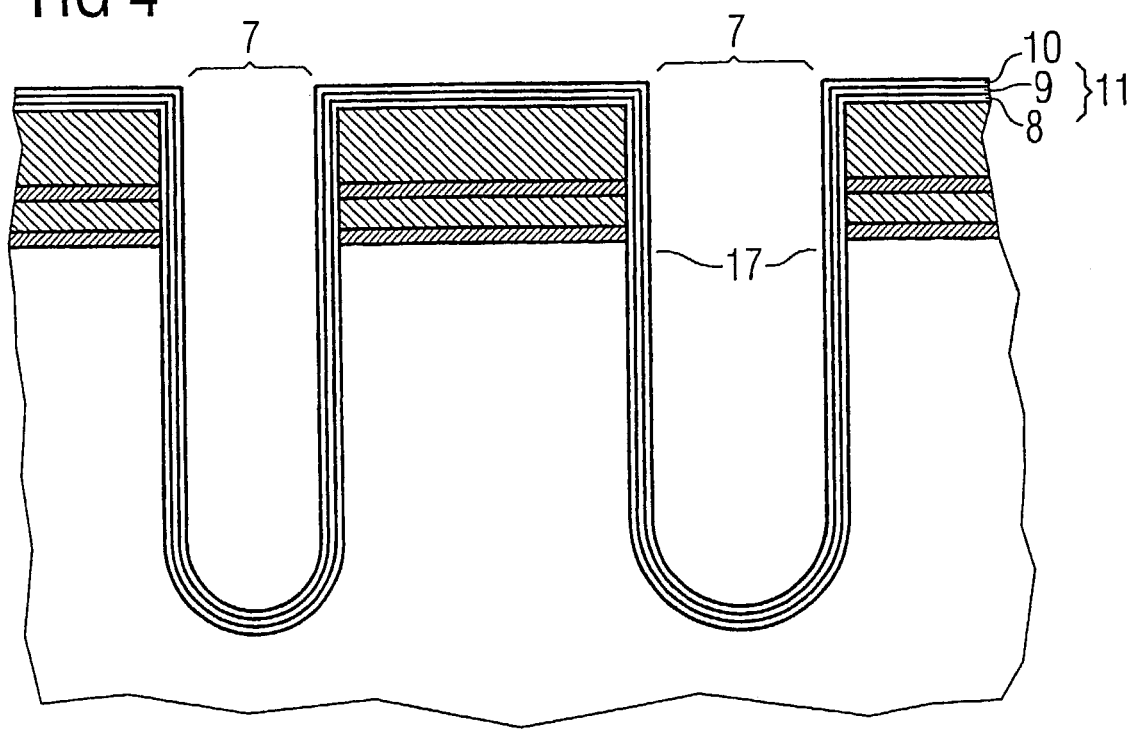
Figure 5:
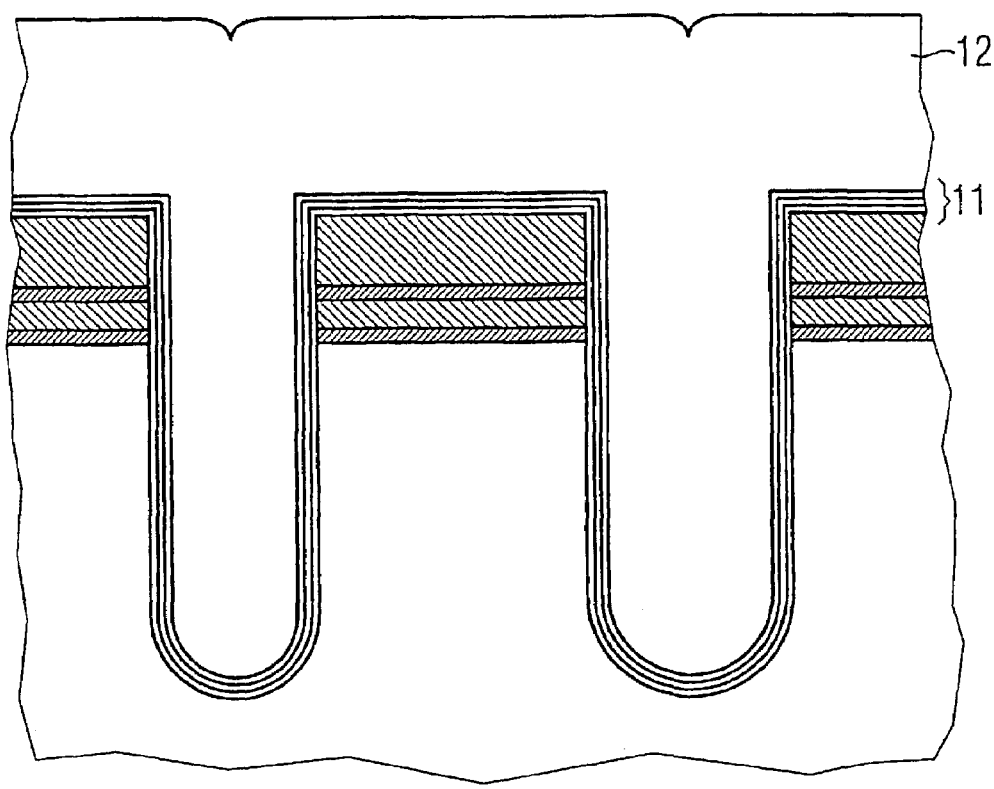
Figure 7:
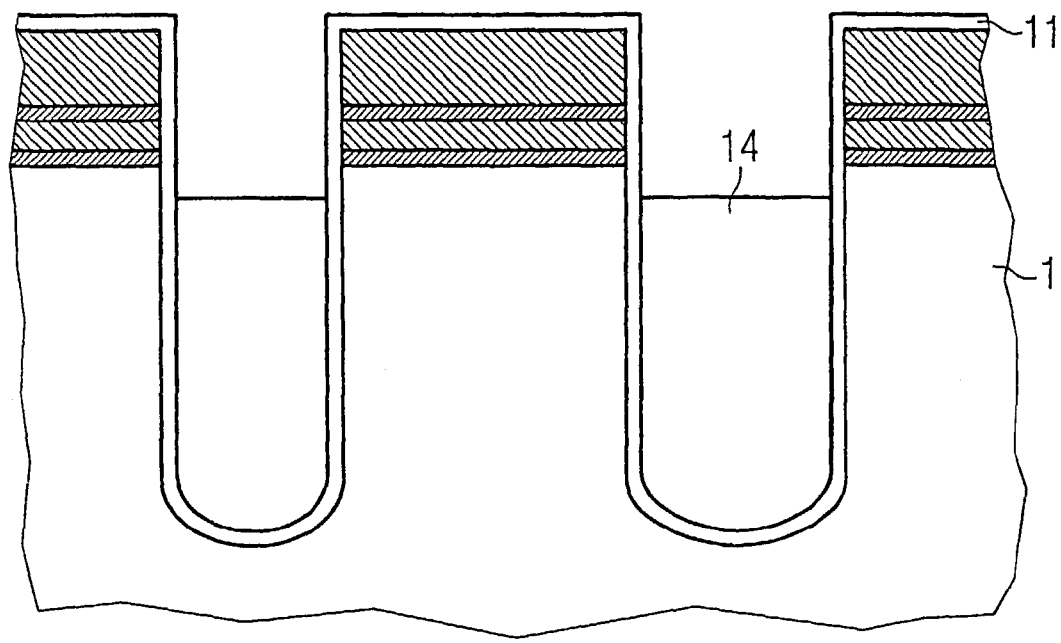

On this structure, as FIG. 4 shows by way of the result, three thin conformal layers are deposited in succession, which also extend along sidewalls 17 of the trenches 7 down to the bottom of the trenches 7. First, a first insulating layer 8 is deposited, then a dielectric layer 9 and finally a second insulating layer 10. The layers 8, 9 and 10 form the layer series 11, which after FIG. 7 is shown as just one layer, since it does not affect the essence of the present invention. Layers 8 and 10 are preferably made of silicon dioxide.

Figure 6:
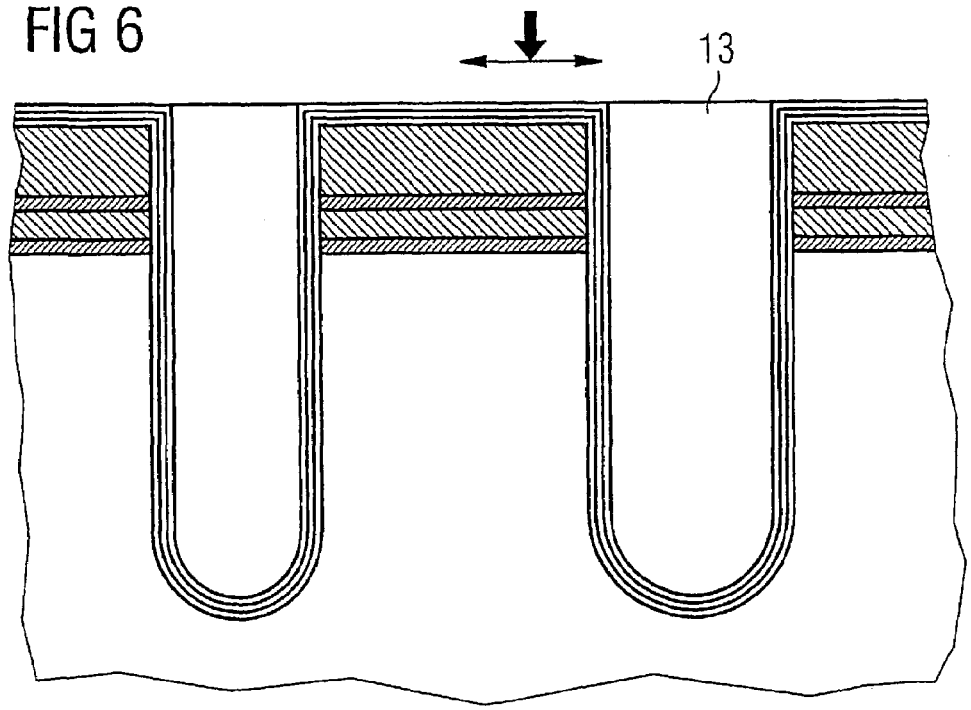

The internal wall 17 of the trenches 7 is now lined with the triple layer 11. To fill the trenches 7, polysilicon 12 is deposited until it covers the entire substrate surface. The polysilicon 12 is then removed by chemical-mechanical polishing down to a top 13 of the horizontal regions of the layer series 11, to which end a polishing pad is pressed against the substrate in the direction of the bold arrow shown in FIG. 6 and is moved at right angles thereto in the direction of the double-headed arrow, the surface of the semiconductor substrate being polished in the process.

Figure 8:
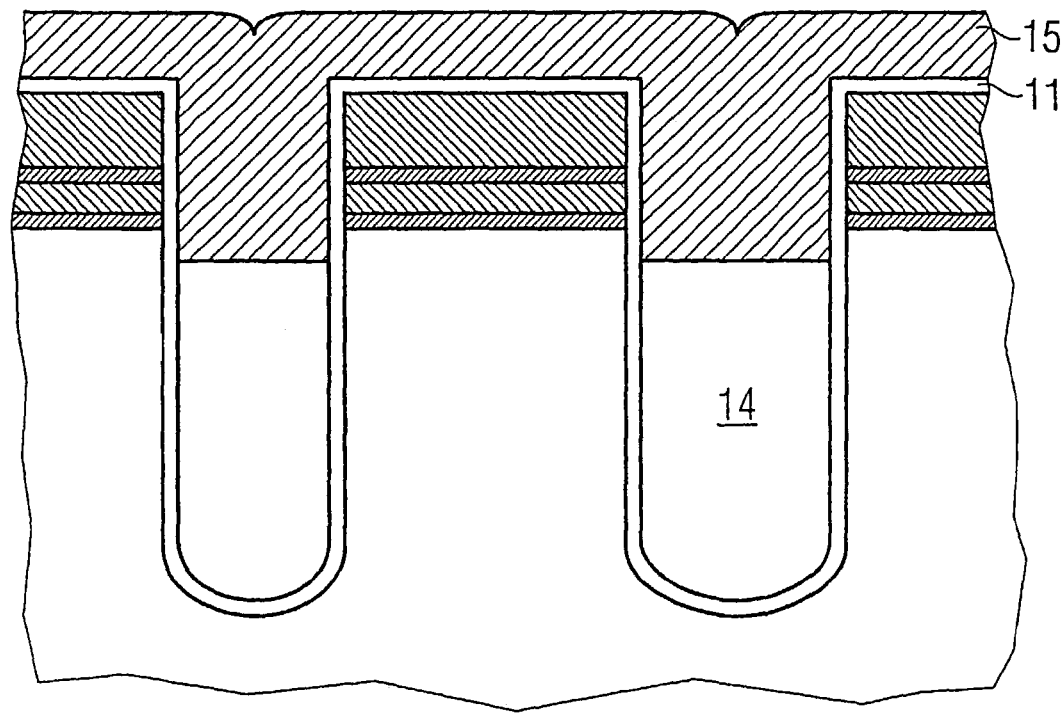
Figure 9:
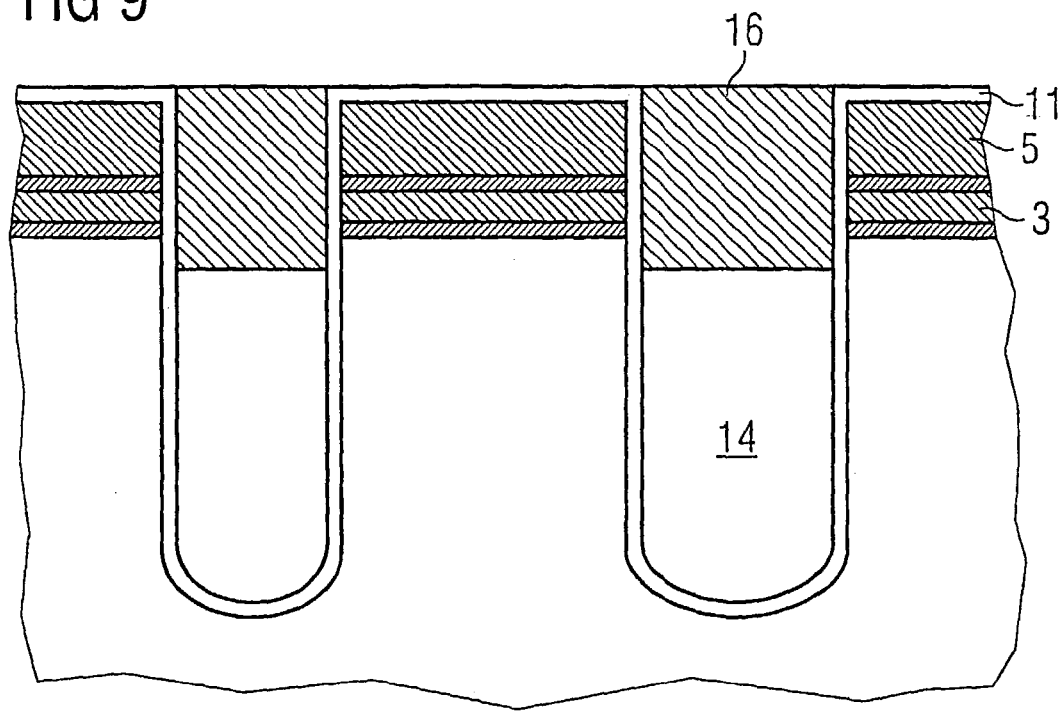

The resulting trench filling 14 made of the polysilicon 12 was back-etched using a dry etching process down to a level below the surface of the substrate material 1. Above the back-etched trench filling 14, an oxide 15 is deposited, as shown in FIG. 8. The oxide 15 is also subjected to chemical-mechanical planarization, resulting in the top trench fillings 16 shown in FIG. 9, which, in contrast to the bottom trench fillings 14, are not electrically conductive.

Figure 10:
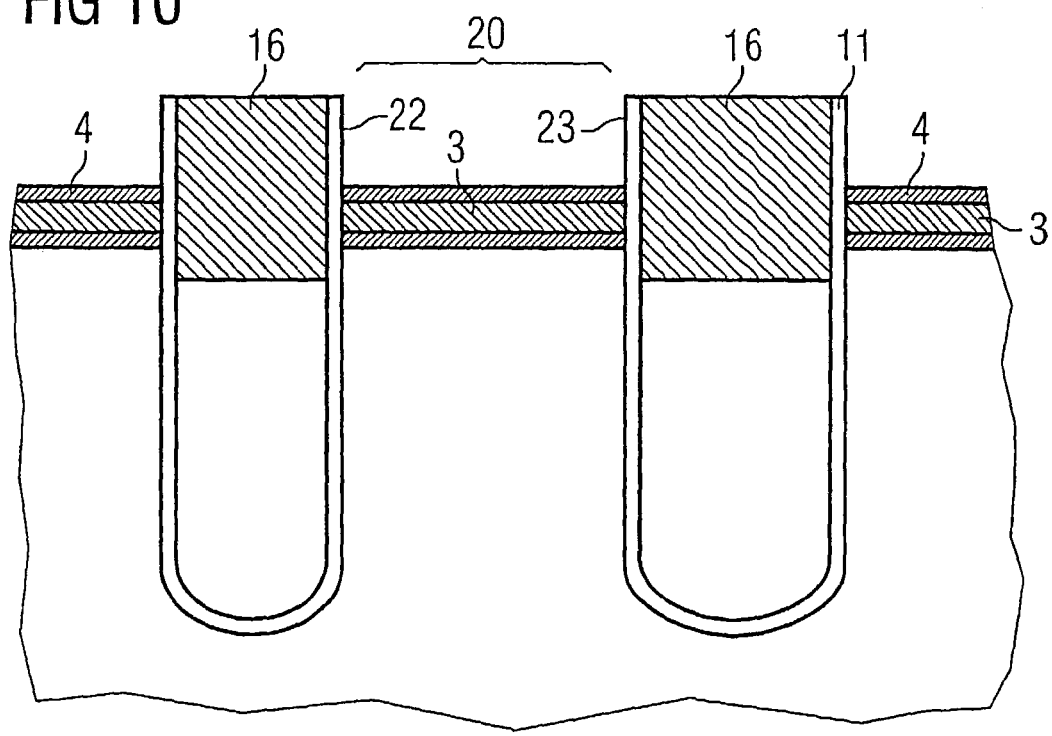

The present invention relates, in essence, to the formation of a trench having a smaller width than the structure width. The trench needs to be etched in the center of the interspace between the trenches already produced in FIG. 9. In line with the invention, such a narrow trench is structured using two spacers that are produced on the sidewalls of a depression. In accordance with one development of the invention that S allows very narrow structures to be produced even on the surface of initial elevations, two trenches, namely the trenches 7, are filled with the trench filling 16. The trench fillings 16 extend to above the top nitride layer 5. If, as FIG. 10 shows, the top nitrate layer 5 is now removed using an etching process, the top trench fillings 16 extend above the next lowest layer 4, the oxide layer, and form sidewalls 22 and 23 of a depression 20 on the mutually facing sides of the two trenches. The depression 20 between the trench fillings 16 provides the prerequisites for producing a very narrow trench in accordance with the inventive method.

To this end, as FIG. 11 shows, a spacer layer 21 is deposited and is then back-etched anisotropically using an etching medium 24 which is accelerated in the direction of the arrows shown, i.e. in a direction perpendicular to the substrate surface. Of the conformally deposited spacer layer 21 made essentially of silicon oxide, only spacers 25 remain on the outer walls of the trench fillings 16 and thus on the sidewalls of the depression 20 between the etched trenches 7, as shown in FIG. 12. Etching of the spacer layer 21 has also been continued after the underside of the space layer 21 was reached, until the oxide layer 4, the bottom nitride layer 3 and the gate oxide 2 have also been etched between the trench fillings 16. Between the mutually facing spacers 25 there remains an interspace d having a width that twice as small as than the width D of the depression 20 between the top trench fillings 16.

Figure 13:
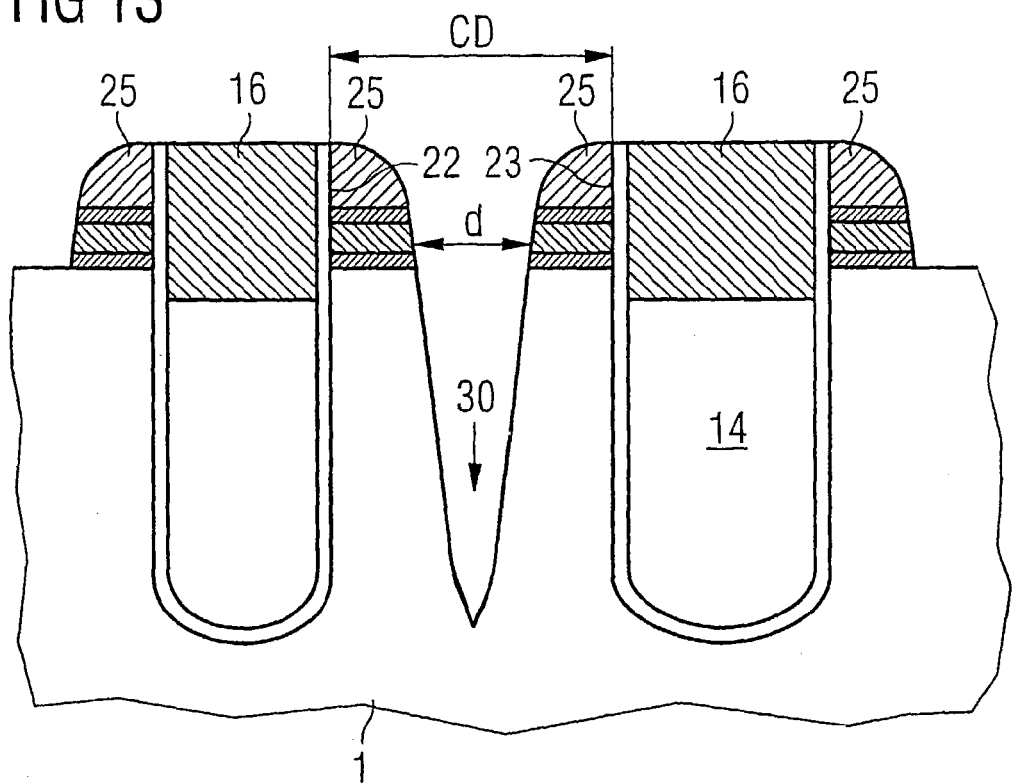
Figure 14:
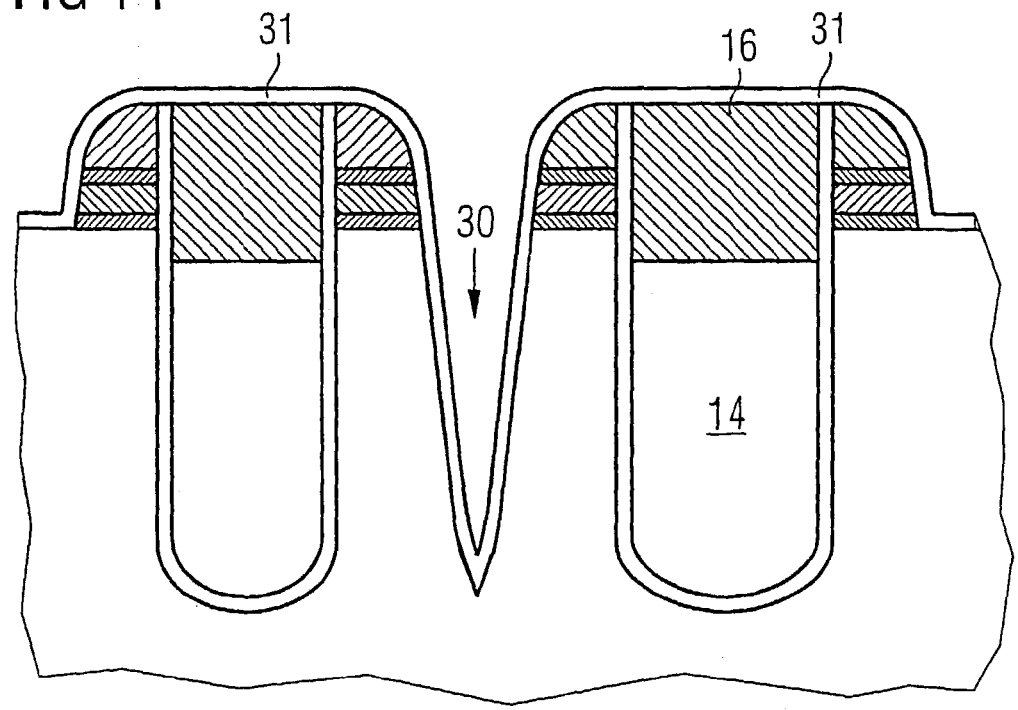
Figure 15:
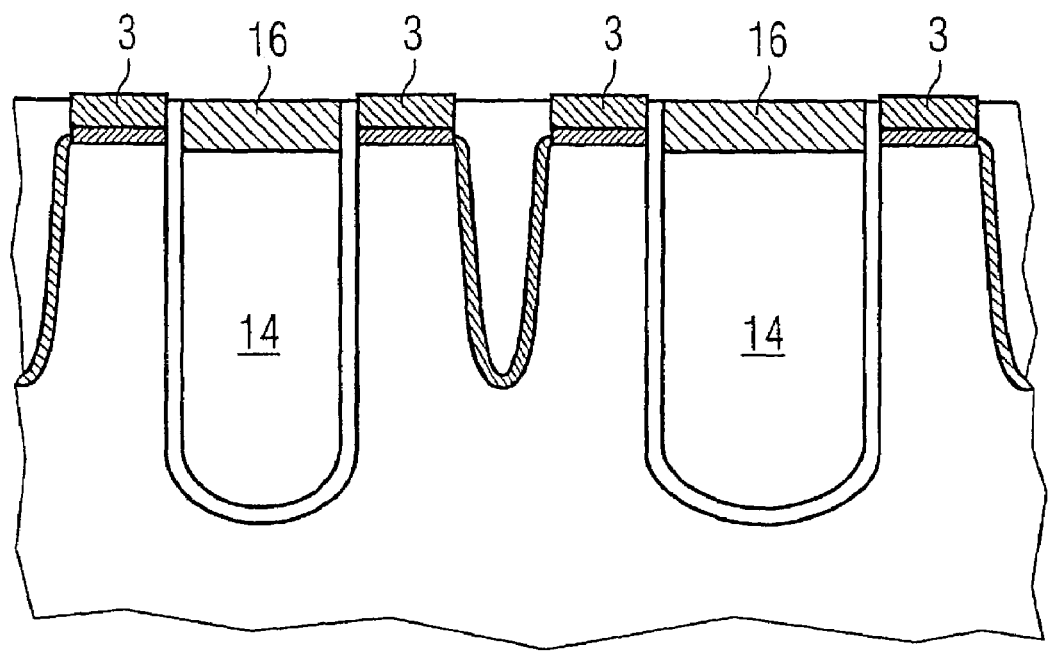
Figure 16:
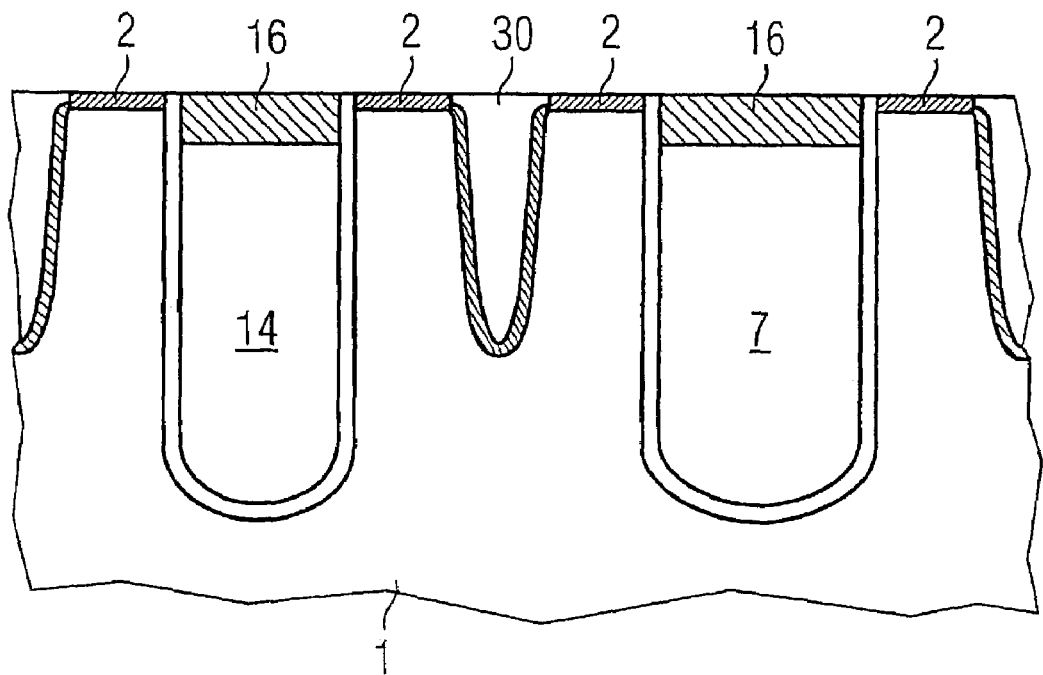

In line with the invention, a structure of width d can now be formed in which the semiconductor substrate 1 provided with the spacers 25 and machined in a suitable manner. In the method shown in the figures, the structure etched is a narrow trench 30, as shown in FIG. 13. The trench 30 is then provided with a thin oxide layer 31, as shown in FIG. 14, and is finally filled completely with an electrical insulator, essentially with silicon dioxide. Finally, as shown for the result in FIG. 15, the surface of the semiconductor substrate covered with the filling in the trench 30 is subjected to chemical-mechanical planarization until the surface of the bottom nitride layer 3 is reached. The layer 3 is then also carefully removed until the gate oxide layer 2 on the semiconductor substrate has been reached. In this state, which is shown in FIG. 16, a much narrower insulating trench 30 is formed between the lithographically structured trenches 7. The trench 30 is much smaller than the trenches 7 produced with the lithographic resolution limit. Such a narrow trench 30 or any other structure having such narrowness cannot be produced at all using a conventional method.

The method described in the present case allows integrated structures that are very much smaller than the optical resolution limit to be produced using available lithographic instruments. This opens up new technical dimensions. The resolution limit for lithographic mask exposure is no longer an obstacle on the way to progressive miniaturization. The inventive use of spacer technology to produce two spacers on opposite sidewalls of a depression allows structures, for example trenches, epitaxial layers or doping regions etc., having a width of between zero and the lithographic resolution limit to be produced. The desired width of the structure 30 to be produced is simply set using the layer thickness of the deposited spacer layer 21; the width d of the structure 30 is the same as the optical resolution limit D less twice the layer thickness of the spacer layer 21, i.e. less twice the width of a spacer 25.

The present invention can be used to fabricate any integrated semiconductor circuits; in particular, insulating trenches with a very narrow width can be produced between adjacent memory cells, where further structuring using conventional lithographic techniques is not possible for space reasons. Thus, by way of example, the structure shown in FIG. 16 can be developed to form a memory circuit with floating gate transistors. Floating gate electrodes thereof are formed by the dielectric layer 9 on a respective left or right internal wall of the filled trenches 7. The bottom trench filling 14 is a word line for connecting the gate electrodes. In the superficial region of the substrate material 1, implantations for the source and drain electrodes still need to produced on each sidewall of one of the trenches 7.

In a memory circuit of this type, adjacent trenches 7 must not be too close together, since it must be possible to operate the transistors that need to be formed on their unilaterally facing sidewalls independently of one another. If the narrow trench 30 were not present, reversing the charge of a transistor on the right sidewall of the left trench 7 could also result in hot charge carriers reversing the charge of a transistor on the left sidewall of the right trench 7, which is manifested as a crosstalk problem. With a conventional method, in which integrated structures are produced exclusively by lithographic techniques, the insulating trench 30 could not be produced between the trenches 7, since its width is less than the lithographic resolution limit CD, and the two trenches 7 are spaced apart precisely by the lithographic resolution limit CD. Only using the present invention and its development to produce a narrow structure on an initial elevation as well, namely in the region of the substrate surface between the two trenches 7 (see FIG. 3 and FIG. 10), is it possible to produce the insulating trench 30. The width thereof is approximately one third of the lithographic resolution limit. In the structure shown in FIG. 16, the trench itself is used for electrically shielding the regions of the dielectric layers 9 on the mutually facing sidewalls of the trenches 7 from one another in a region that is very close below the substrate surface.

The dimensions shown in FIGS. 1 to 16 for the individual structures, particularly the layer thicknesses, are not shown to scale. Preferably, the layer thickness of the gate oxide layer 2 is between 5 and 10 nm, the layer thickness of the first nitride layer 3 is between 30 and 300 nm, the thickness of the oxide layer 4 is between 10 and 30 nm, the thickness of the top nitride layer is between 100 and 300 nm, the thickness of the mask layer 6 made of borosilicate glass is between 200 and 500 nm, the depth of the trenches 7 for producing word lines is between 0.5 and 3.0 µm, the layer thickness of the first (bottom oxide 8) and of the second (top oxide 10) oxide layer is respectively between 3 and 6 nm, the thickness of the dielectric nitride layer in between is between 3 and 10 nm, the depth of the back-etching of the polysilicon below the substrate surface is between 50 and 200 nm, and the thickness of a thermal oxide layer 3 produced in the insulating trench produced in accordance with the invention is between 3 and 10 nm.

I claim:

1. A method for processing a substrate to form a structure using a lithographic mask exposure, which comprises the steps of:
    providing the substrate;
    etching two trenches disposed at a distance from one another, the distance corresponding to an optical resolution limit of the lithographic mask exposure;
    filling the trenches with a trench filling resulting in filled trenches, wherein filling the trenches includes forming word lines in the two trenches;
    back-etching a material other than a material of the trench filling in an interspace between the filled trenches at a level of the trench filling resulting in a depression;
    producing spacers in the depression on opposite sidewalls of the depression, the spacers being at a distance from one another which is less than the optical resolution limit for the lithographic mask exposure; and
    etching in a region of the depression for forming an insulating trench disposed between the spacers, a width of the insulating trench being less than the optical resolution limit for the lithographic mask exposure.

2. The method according to claim 1, further comprising the step of filling the insulating trench with an electrical insulator.

3. The method according to claim 1, which comprises producing the spacers by depositing a conformal layer onto the substrate after the depression has been formed and back-etching the conformal layer in a direction perpendicular to a surface of the substrate using an anisotropic etching process.

4. The method according to claim 3, which comprises forming the conformal layer from silicon dioxide deposited on the substrate for producing the spacers.

5. The method according to claim 1, further comprising the steps of:
    depositing a sacrificial layer before the two trenches are etched; and
    back-etching the sacrificial layer in the interspace between the trenches, the sacrificial layer being the material in the interspace.

6. The method according to claim 5, further comprising forming the sacrificial layer from nitride.

7. The method according to claim 1, further comprising the steps of depositing a first insulating layer, a dielectric layer and a second insulating layer onto internal walls of the trenches between the steps of etching the two trenches and the filling of the trenches.

8. The method according to claim 1, further comprising the step of providing a preprocessed semiconductor substrate having an oxide layer as the substrate.

9. The method according to claim 6, which comprises using a silicon nitride as the nitride.

* * * * *